(12) United States Patent
Kidd et al.

(10) Patent No.: US 12,213,273 B2
(45) Date of Patent: Jan. 28, 2025

(54) SERVER INFORMATION HANDLING SYSTEM WITH POWER SUPPLY UNIT HANDLE ALIGNMENT COMPONENT

(71) Applicant: Dell Products L.P., Round Rock, TX (US)

(72) Inventors: Owen Kidd, Cedar Park, TX (US); Walter R. Carver, Round Rock, TX (US); Justin P. Bandholz, Apex, NC (US)

(73) Assignee: Dell Products L.P., Round Rock, TX (US)

( * ) Notice: Subject to any disclaimer, the term of this patent is extended or adjusted under 35 U.S.C. 154(b) by 111 days.

(21) Appl. No.: 18/133,589

(22) Filed: Apr. 12, 2023

(65) Prior Publication Data

US 2024/0349439 A1    Oct. 17, 2024

(51) Int. Cl.
*H05K 7/14* (2006.01)

(52) U.S. Cl.
CPC ......... *H05K 7/1489* (2013.01); *H05K 7/1492* (2013.01)

(58) Field of Classification Search
CPC .......................... H05K 7/1489; H05K 7/1492
See application file for complete search history.

(56) References Cited

U.S. PATENT DOCUMENTS

| 11,183,801 B2 * | 11/2021 | Li ..................... H05K 7/14325 |
| 11,509,079 B2 * | 11/2022 | Tsai ..................... H01R 12/7005 |
| 11,564,326 B2 * | 1/2023 | Chen ..................... F04D 25/0693 |
| 2021/0051814 A1 * | 2/2021 | Carver ................. H05K 7/1489 |

* cited by examiner

*Primary Examiner* — Imani N Hayman
*Assistant Examiner* — Hung Q Dang
(74) *Attorney, Agent, or Firm* — Terrile, Cannatti & Chambers, LLP; Stephen A. Terrile

(57) ABSTRACT

A blind mate rack alignment component for a server type information handling system. The blind mate rack alignment component includes an alignment system mounting plate, the alignment system mounting plate defining a mounting space via which a power supply cable connector is coupled to the alignment system mounting plate and a blind mate alignment portion affixed to the alignment system mounting plate, the blind mate alignment portion interacting with a handle of a power supply to align the server type information handling system when the server type information handling system is inserted into a server rack in which the blind mate alignment portion is mounted.

10 Claims, 18 Drawing Sheets

SERVER INFORMATION HANDLING SYSTEM WITH POWER SUPPLY UNIT HANDLE ALIGNMENT COMPONENT

BACKGROUND OF THE INVENTION

Field of the Invention

The present invention relates to information handling systems. More specifically, embodiments of the invention relate to server type information handling systems within information technology (IT) environments.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to use information handling systems and related IT systems within information technology (IT) environments such as data centers.

SUMMARY OF THE INVENTION

A system and method for enabling non-guided connectors to mate with existing server power supplies using existing features on the server supply to guide the non-guided connector into the appropriate seating position.

In one embodiment, the invention relates to a blind mate rack alignment component for a server type information handling system, comprising: an alignment system mounting plate, the alignment system mounting plate defining a mounting space via which a power supply cable connector is coupled to the alignment system mounting plate; and, a blind mate alignment portion affixed to the alignment system mounting plate, the blind mate alignment portion interacting with a handle of a power supply to align the server type information handling system when the server type information handling system is inserted into a server rack in which the blind mate alignment portion is mounted.

In another embodiment, the invention relates to a server rack comprising: a blind mate rack component extending across a rear portion of the server rack; and, a blind mate rack alignment component mounted to the blind mate rack component, the blind mate rack alignment component comprising an alignment system mounting plate, the alignment system mounting plate defining a mounting space via which a power supply cable connector is coupled to the alignment system mounting plate; and, a blind mate alignment portion affixed to the alignment system mounting plate, the blind mate alignment portion interacting with a handle of a power supply to align a server type information handling system when the server type information handling system is inserted into the server rack in which the blind mate alignment portion is mounted.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Various aspects of the disclosure include an appreciation that server racks can be configured with a blind mate power solution where a server type information handling system is mated with a power source when the server type information handling system is inserted into the server rack. Various aspects of the disclosure include an appreciation that it would be desirable to provide blind mate power solutions with alignment features to assure power and/or high-speed connectors mate reliably between the supply and receiving connectors.

Various aspects of the disclosure include an appreciation that with certain known blind mate power solutions, the power is transmitted through a supply/receive pair of independent connectors which are guided by specialized integrated alignment features. This solution increases cost and complexity of the blind-mate solution by requiring multiple power point connections between power distribution unit (PDU) and supply versus a direct plug from a power distribution unit into supply. For example, these specialized integrated alignment features typically involve separate, fixed alignment pins that are not pre-existing features of the design (whether independently implemented, or as a function of an additional connector included to serve the power/signal connection purpose).

A system and method are disclosed for enabling non-guided connectors to mate with existing server power supplies using existing features on the server supply to guide the non-guided connector into the appropriate seating position. In certain embodiments, the system and method provide a blind mate power supply unit alignment solution which uses one or more power supply cables attached to a power distribution unit, a rack mount server with fixed power supply unit (PSU) locations, and a blind mate power interface bar. In certain embodiments, the blind mate power interface bar includes one or more pre-defined mounting spaces for the server-side connector of the power supply cable from the PDU. The pre-defined mounting spaces for the server-side connector of the power supply cable are attached to a blind mate guide facet which seats over the existing PSU handle to provide alignment for the server-side connector of the power supply cable.

Such a blind mate power supply unit alignment solution advantageously uses existing features (e.g., existing connectors and handles) to enable non-guided connectors to mate with existing server power supplies while using existing features on the server supply to guide the non-guided connector into the appropriate seating position. Such a blind mate power supply alignment solution may be implemented on whichever power supply unit or cable connector type that is appropriate for the server design.

Figure 1:
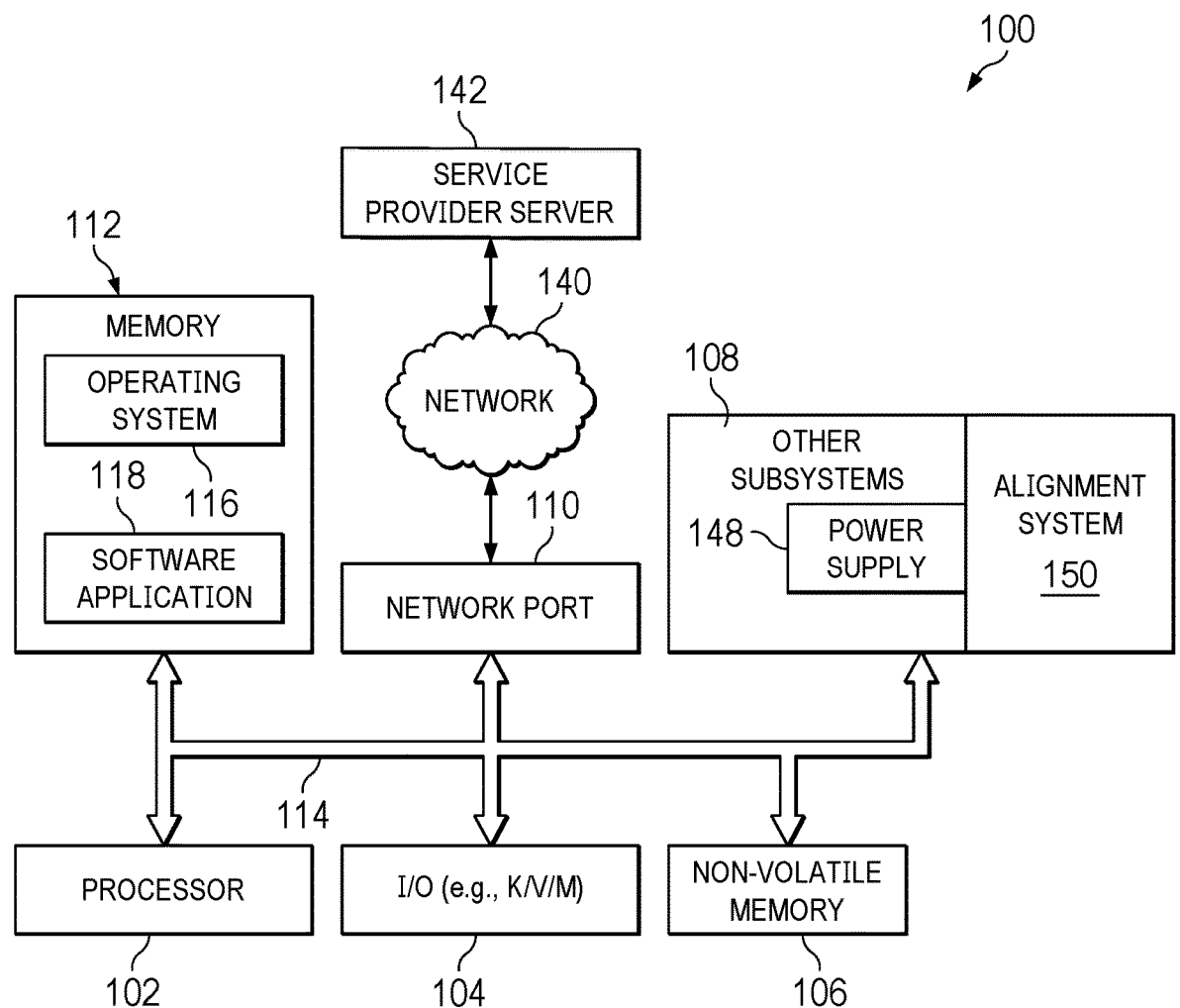
FIG. 1 shows a general illustration of components of an information handling system as implemented in the system and method of the present invention.

FIG. 1 shows a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. The information handling system 100 likewise includes system memory 112, which is interconnected to the foregoing via one or more buses 114. System memory 112 further comprises operating system (OS) 116. In certain embodiments, the information handling system 100 is one of a plurality of information handling systems within a data center. In certain embodiments, the information handling system 100 comprises a server type information handling system. In certain embodiments, the server type information handling system is configured to be mounted within a server rack. In certain embodiments, the other subsystem 108 includes one or more power supplies 148 for supplying power to the other components of the information handling system 100.

In certain embodiments, the information handling system 100 comprises a server type information handling system. In certain embodiments, the server type information handling system comprises a rack server type information handling system. As used herein, a rack server type information handling system broadly refers to an information handling system which is physically configured to be mounted within a server rack.

In certain embodiments, the one or more power supplies of the information handling system 100 interact with a rack to provide a blind mate power supply unit alignment system 150. In certain embodiments, the blind mate power supply unit alignment system 150 enables non-guided connectors to mate with existing server power supplies using existing features on the server supply to guide the non-guided connector into appropriate seating position. In certain embodiments, the blind mate power supply unit alignment system 150 provides a blind mate power supply unit alignment solution which uses one or more power supply cables attached to a power distribution unit, a rack mount server with fixed power supply unit locations, and a blind mate power interface bar. In certain embodiments, the blind mate power interface bar includes one or more pre-defined mounting spaces for the server-side connector of the power supply cable from the power distribution unit. In certain embodiments, the pre-defined mounting spaces for server-side connector of the power supply cable are attached to a blind mate guide facet which seats over the existing power supply unit handle to provide alignment for the server-side connector of the power supply cable.

Such a blind mate power supply unit alignment system advantageously uses existing features (e.g., existing connectors and handles) to enable non-guided connectors to mate with existing server power supplies while using existing features on the server supply to guide the non-guided connector into the appropriate seating position. Such a blind mate power supply alignment system may be implemented on whichever power supply unit or cable connector type that is appropriate for the server design.

Figure 2:
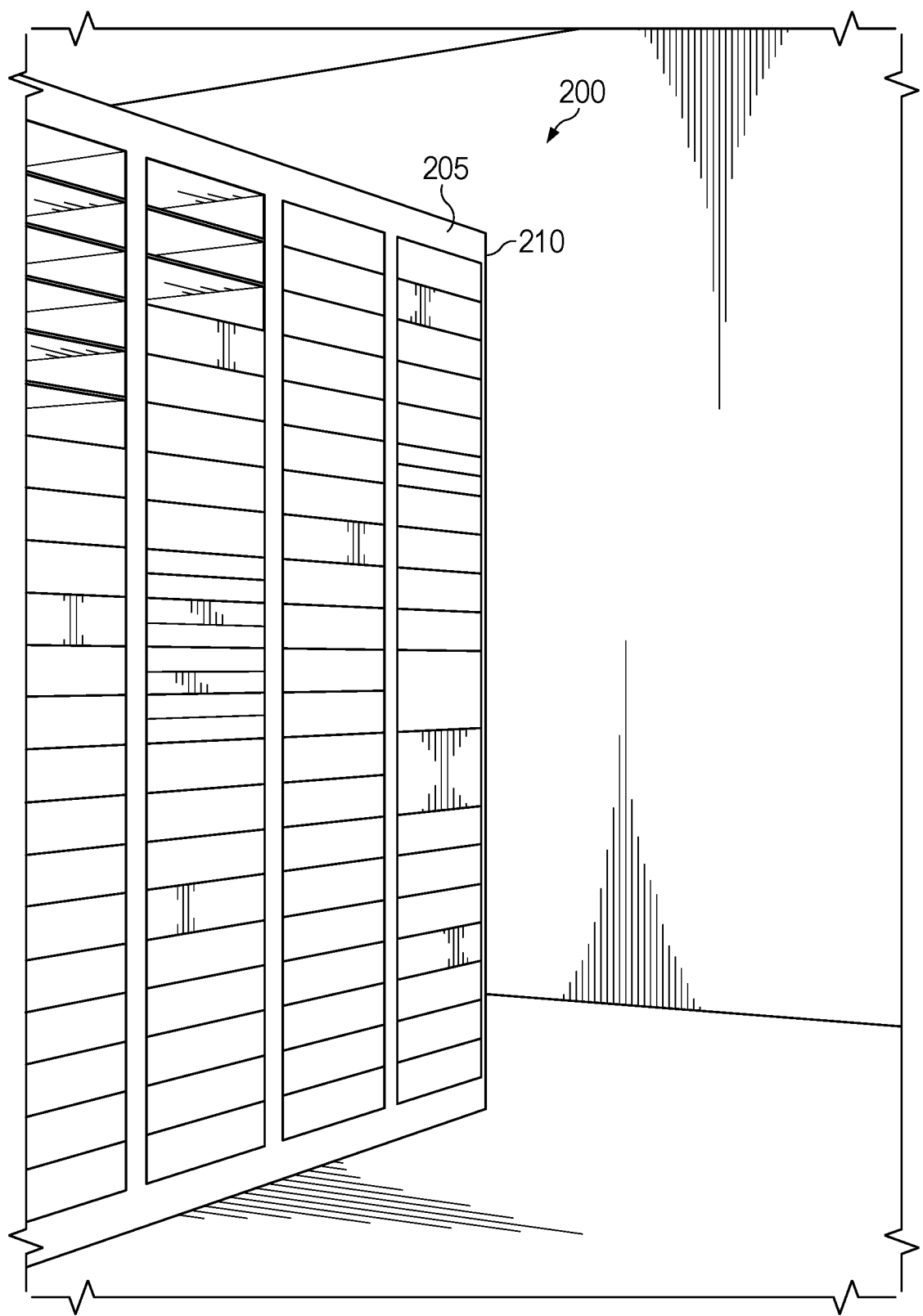
FIG. 2 shows a perspective view of a portion of a data center within an IT environment.

FIG. 2 shows a perspective view of a portion of an IT environment 200. The IT environment includes one or more racks 205 which include a plurality of information handling systems 100, often referred to as a server rack. In various embodiments, the IT environment 200 comprises a data center. As used herein, a data center refers to an IT environment which includes a plurality of networked information handling systems 100. In various embodiments, the information handling systems 100 of the data center include some or all of router type information handling systems, switch type information handling systems, firewall type information handling systems, storage system type information handling systems, server type information handling systems and application delivery controller type information handling systems. In certain environments, the information handling systems 100 are mounted within respective racks. As used herein, a rack refers to a physical structure that is designed to house the information handling systems 100 as well as the associated cabling and power provision for the information handling systems. In certain embodiments, a rack includes side panels to which the information handling systems are mounted. In certain embodiments, the rack includes a top panel and a bottom panel to which the side panels are attached. In certain embodiments, the side panels each include a front side panel and a rear side panel.

In certain embodiments, a plurality of racks is arranged continuous with each other to provide a rack system. An IT environment can include a plurality of rack systems arranged in rows with aisles via which IT service personnel can access information handling systems mounted in the racks. In certain embodiments, the aisles can include front aisles via which the front of the information handling systems may be accessed and hot aisles via which the infrastructure (e.g., data and power cabling) of the IT environment can be accessed.

Each respective rack includes a plurality of vertically arranged information handling systems 210. In certain embodiments, the information handling systems may conform to one of a plurality of standard server sizes. In certain embodiments, the plurality of server sizes conforms to particular rack unit sizes (i.e., rack units). As used herein, a rack unit broadly refers to a standardized server system height. As is known in the art, a server system height often conforms to one of a 1U rack unit, a 2U rack unit and a 4U rack unit. In general, a 1U rack unit is substantially (i.e., +/−20%) 1.75" high, a 2U rack unit is substantially (i.e., +/−20%) 3.5" high and a 4U rack height is substantially (i.e., +/−20%) 7.0" high.

Figure 3A:
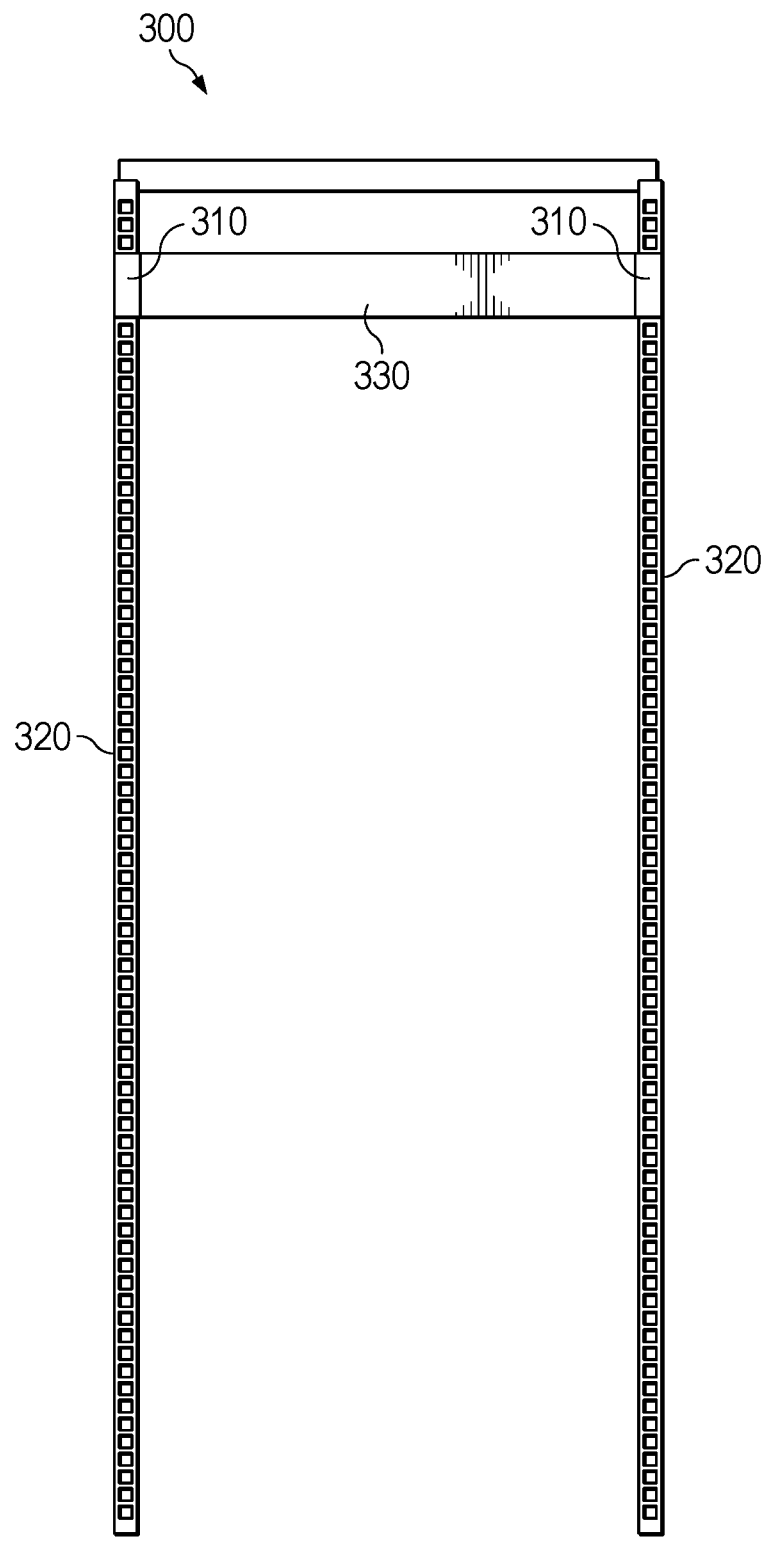
FIGS. 3A, 3B and 3C show a rack front view, a rack side view, and a rack side view with an information handling system in an accessible position.
Figure 3C:
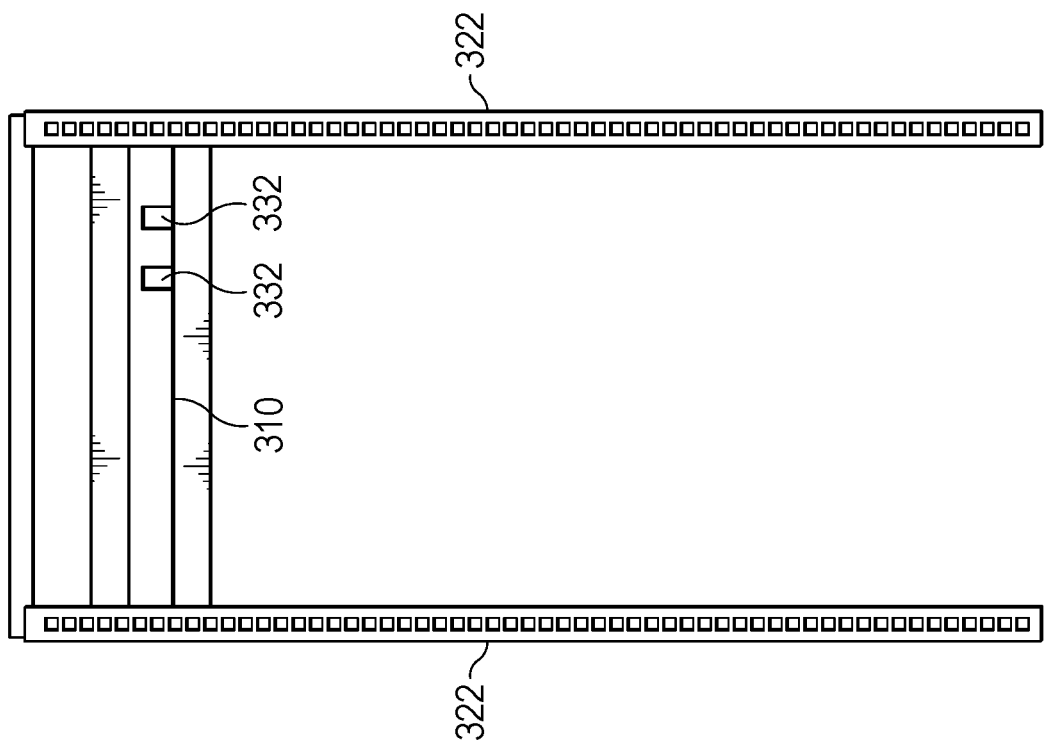
Figure 3B:
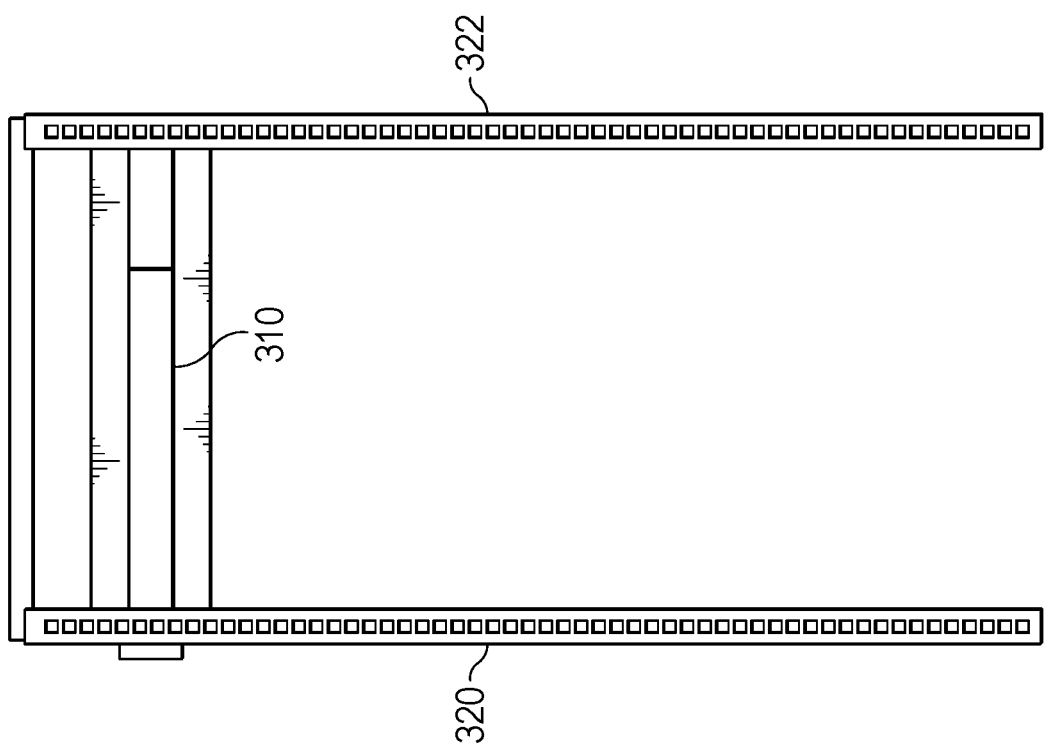

FIGS. 3A, 3B and 3C show a rack front view, a rack side view, and a rack rear view with an information handling system. A first server mounting component 310 is attached to one side of the rack and a second server mounting component 310 is attached to another side of the rack. In certain embodiments, the first server mounting component is attached to a first front side panel 320 and a first rear side panel 322 of the rack 300. In certain embodiments, the second server mounting component is attached to a second front side panel 320 and a second rear side panel 322 of the rack 300. In certain embodiments, the first server mounting component 320 is attached via the mounting apertures 330. In certain embodiments, the second server mounting component is attached via the mounting apertures 330. In certain embodiments, a rear component 330 is attached between the first server mounting component 310 and the second server mounting component 310. In certain embodiments, the rear component 330 includes one or more blind-mate alignment components 332.

In certain embodiments, a rack includes a plurality of vertically arranged mounting components. In certain embodiments, some or all of the vertically arranged mounting components are adapted to mount respective rack server type information handling systems to the rack. In certain embodiments, the server mounting components are configured to correspond to particular rack unit heights. In certain embodiments, the server rack includes one or more blind mate power connectors and the power source is included within the blind mate power connector.

Figure 4:
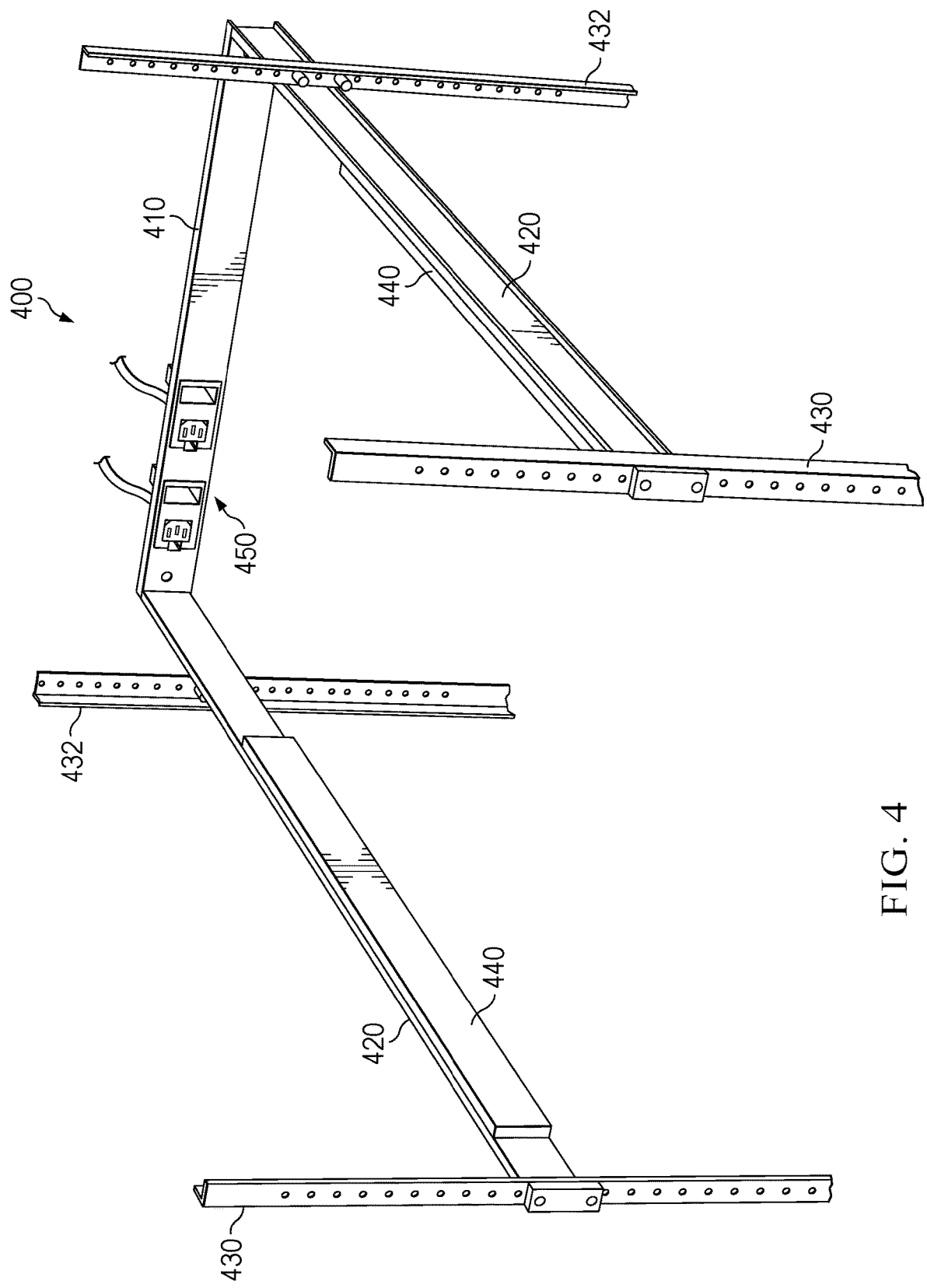
FIG. 4 shows a perspective view of server mounting components attached to a rack.

FIG. 4 shows a perspective view of server mounting components 400 attached to a rack. In certain embodiments, the server mounting components 400 include a server-side blind-mate adapter 410. In certain embodiments, a first server mounting component 420 is attached to one side of the rack and a second server mounting component 420 is attached to another side of the rack. In certain embodiments, the first server mounting component is attached to a first front side panel 430 and a first rear side panel 432 of the rack. In certain embodiments, the second server mounting component is attached to a second front side panel 430 and a second rear side panel 432 of the rack. In certain embodiments, the first server mounting component 420 is coupled to one edge of the server-side blind mate adapter 410. In certain embodiments, the second server mounting component 420 is coupled to another edge of the server-side blind mate adapter 410. In certain embodiments, the server mounting components 400 include one or more mechanical guiding features 440 mechanically coupled to respective server mounting components 420. In certain embodiments, the server-side blind-mate adapter 410 includes one or more rack blind mate alignment components 450. In certain embodiments, each rack blind mate alignment component 450 includes a blind mate power connector 452.

Figure 5:
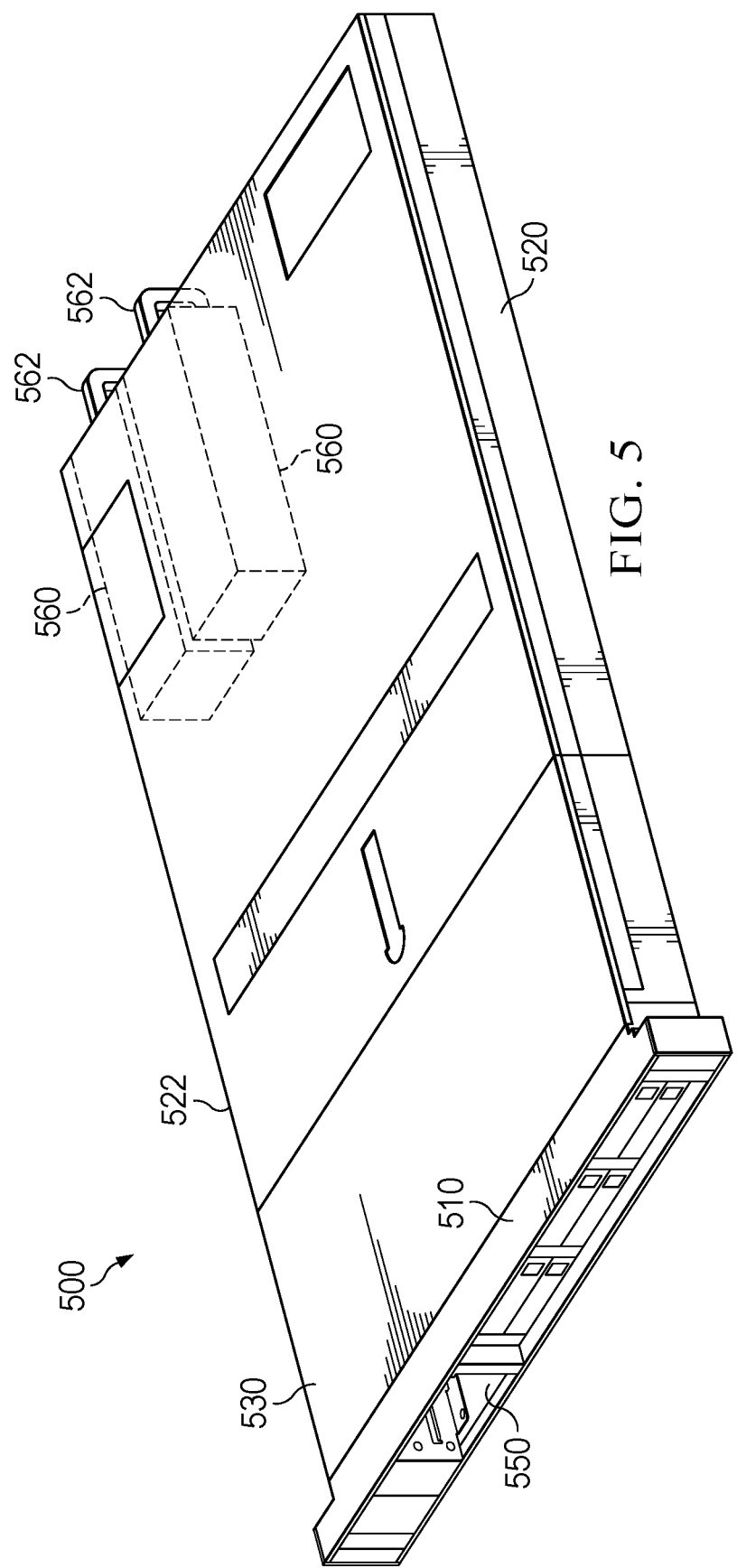
FIG. 5 shows a generalized perspective view of an example rack server type information handling system.

FIG. 5 shows a generalized perspective view of an example rack server type information handling system 500. In certain embodiments, the rack server type information handling system includes a front portion 510, which is accessible when the rack server type information handing system 500 is mounted on a server rack. In certain embodiments, the side portions 520, 522 mount to the rack via respective server mounting components. In certain embodiments, the side portions mount to the rack via respective mechanical guiding features which are mechanically coupled to respective server mounting components. In certain embodiments, the rack server type information handling system can slide out from the rack via the respective mechanical guiding features. In certain embodiments, internal components of the rack type information handling system 500 may be accessed by removing a top panel 530 of the rack type information handling system 500. In certain embodiments, the rack type information handling system 500 includes a bay 550 via which components may be mounted to the rack type information handling system.

In certain embodiments, the information handling system 500 includes one or more power supplies 560. In certain embodiments, each power supply 560 includes a respective handle 562. In certain embodiments, the handle 562 assists with insertion and removal of the power supply 560 in and out of the information handling system 500.

Figure 6A:
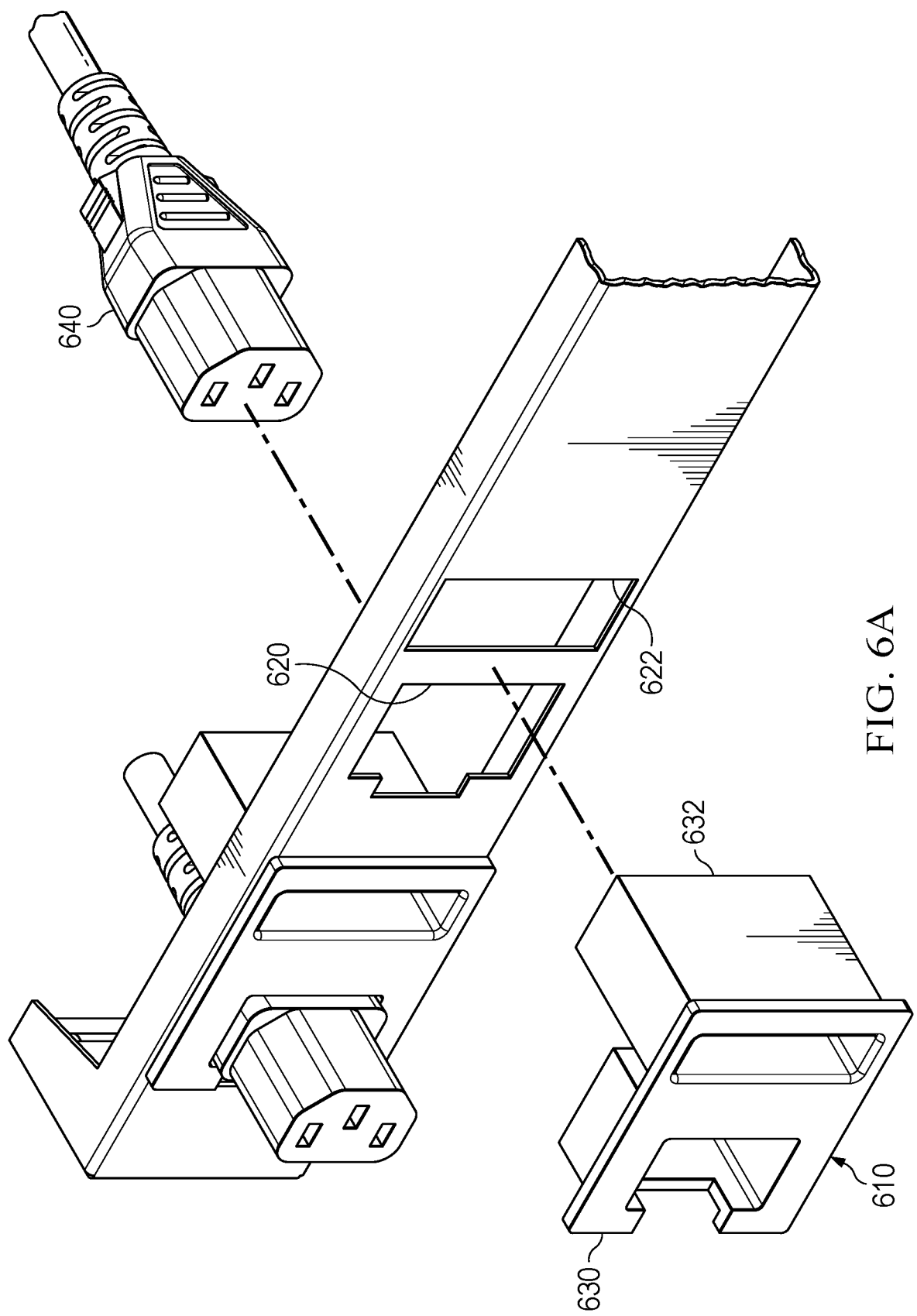
FIGS. 6A and 6B, generally referred to as FIG. 6, show perspective views of a blind mate bracket with a pair of blind mate receptacles.
Figure 6B:
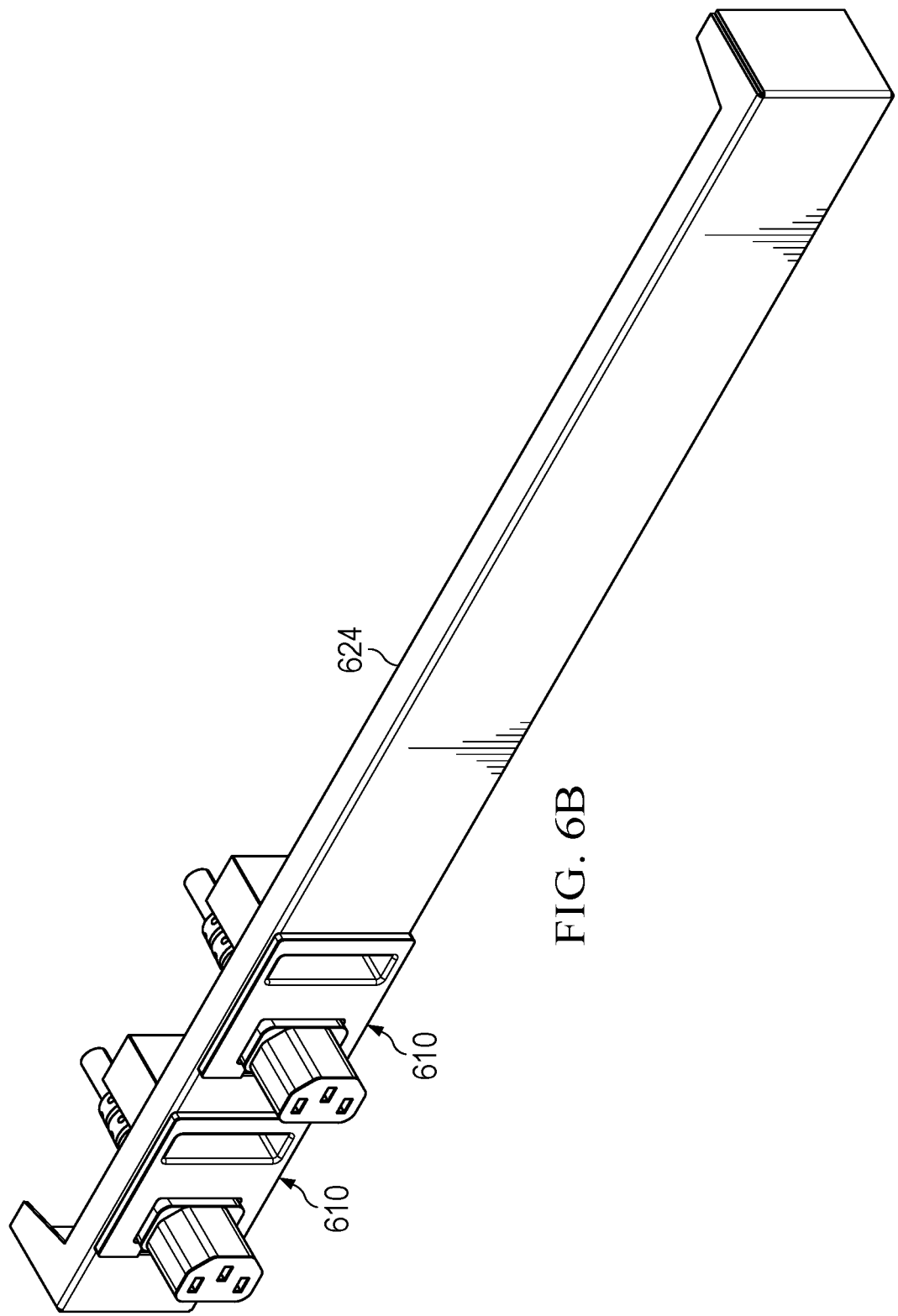

FIGS. 6A and 6B, generally referred to as FIG. 6, show perspective views of a blind mate bracket with a pair of blind mate receptacles. In certain embodiments, a blind mate receptacle 610 is configured to fit into apertures 620, 622 defined by a blind mate bracket 624. In certain embodiments, a power cord portion 630 of the blind mate receptacle 610 fits into aperture 620 and a guide facet portion 632 fits into aperture 622. In certain embodiments, a power cord connector 640 engages with the power cord portion 630 of the blind mate receptacle 610.

Figure 7:
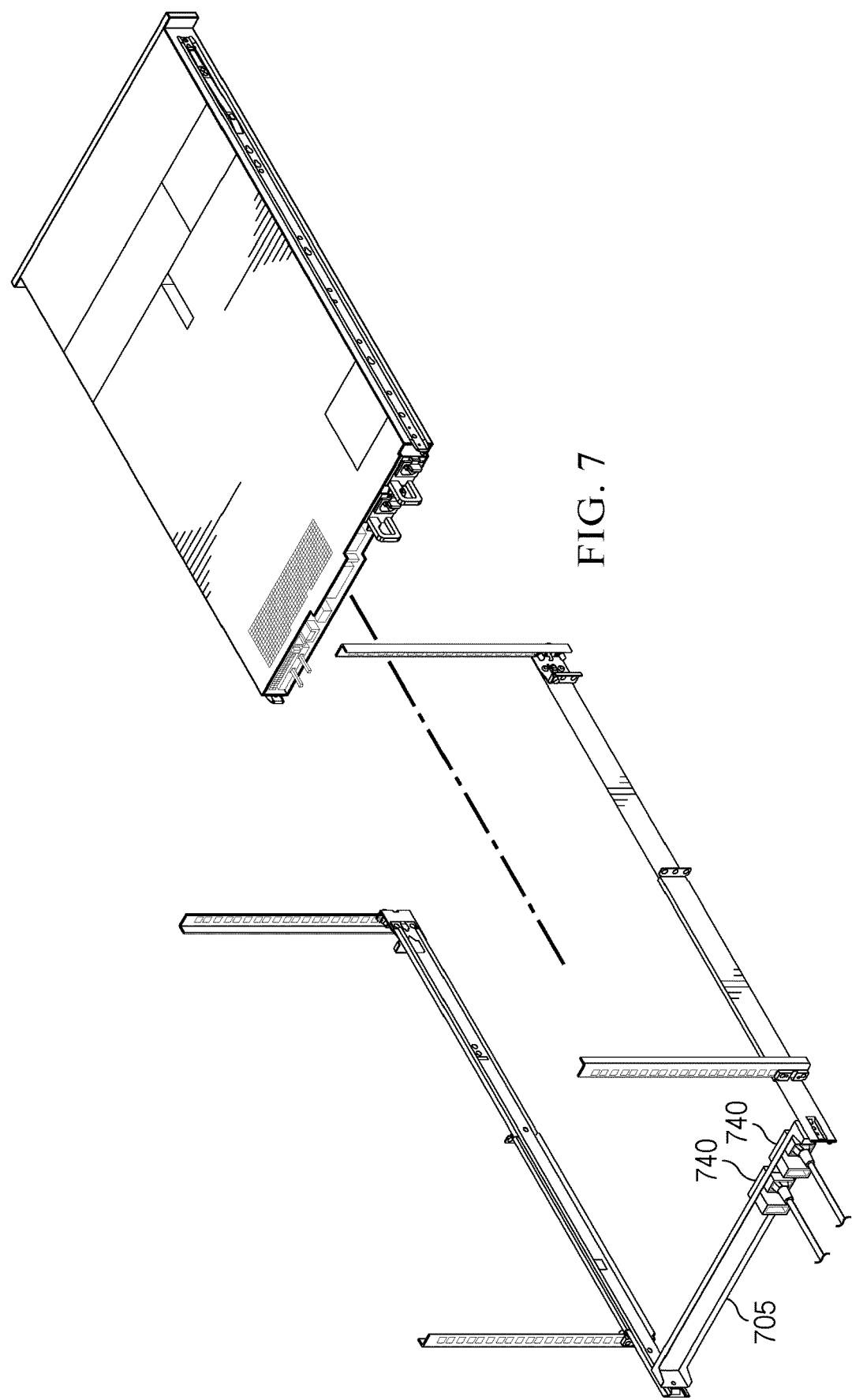
FIG. 7 shows a perspective view of a rack server type information handling system and a portion of a rack to which the rack server type information handling system is mounted.
Figure 8:
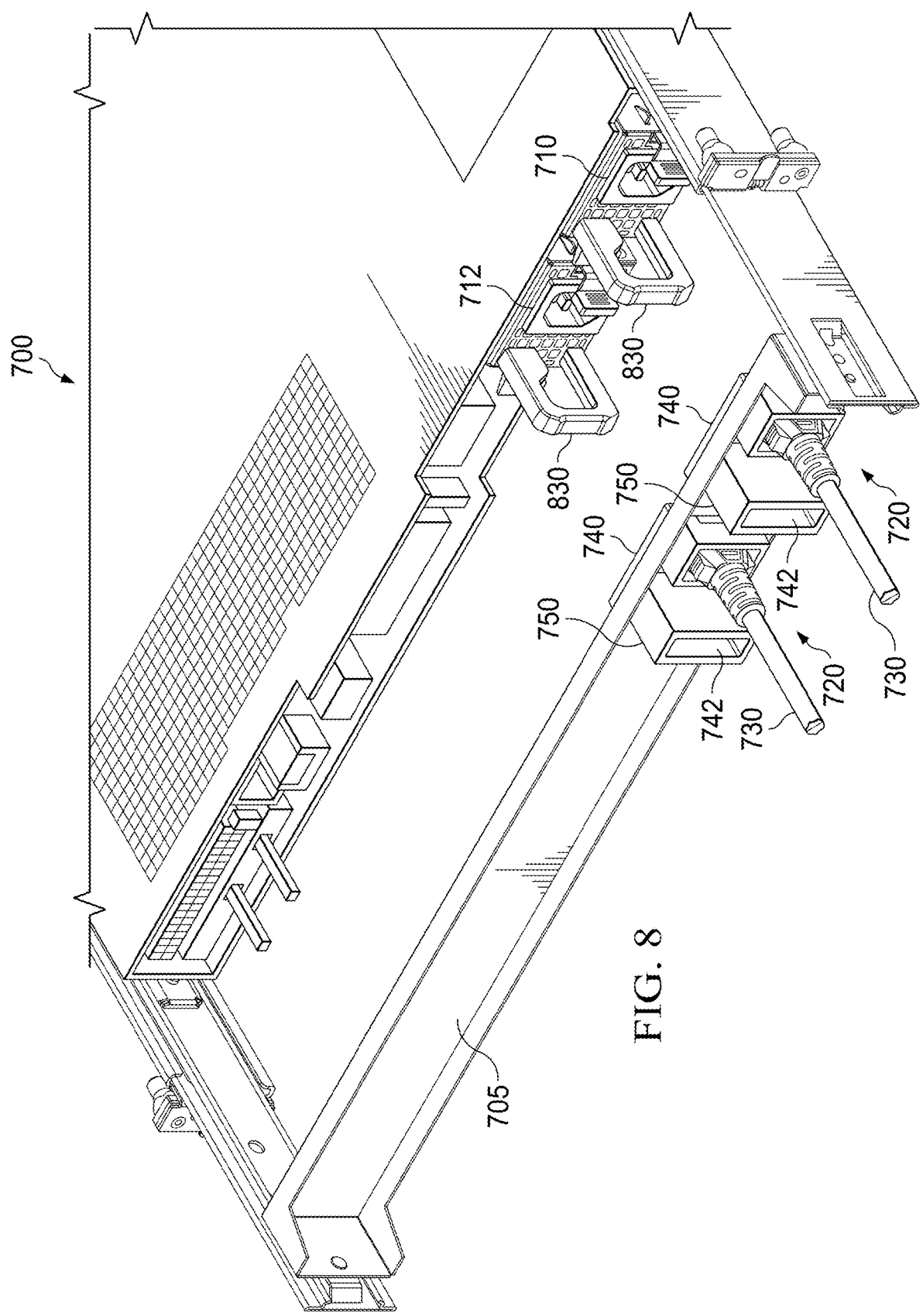
FIG. 8 shows a perspective view of a rear of rack server type information handling system and a rack blind mate mounting component.
Figure 9:
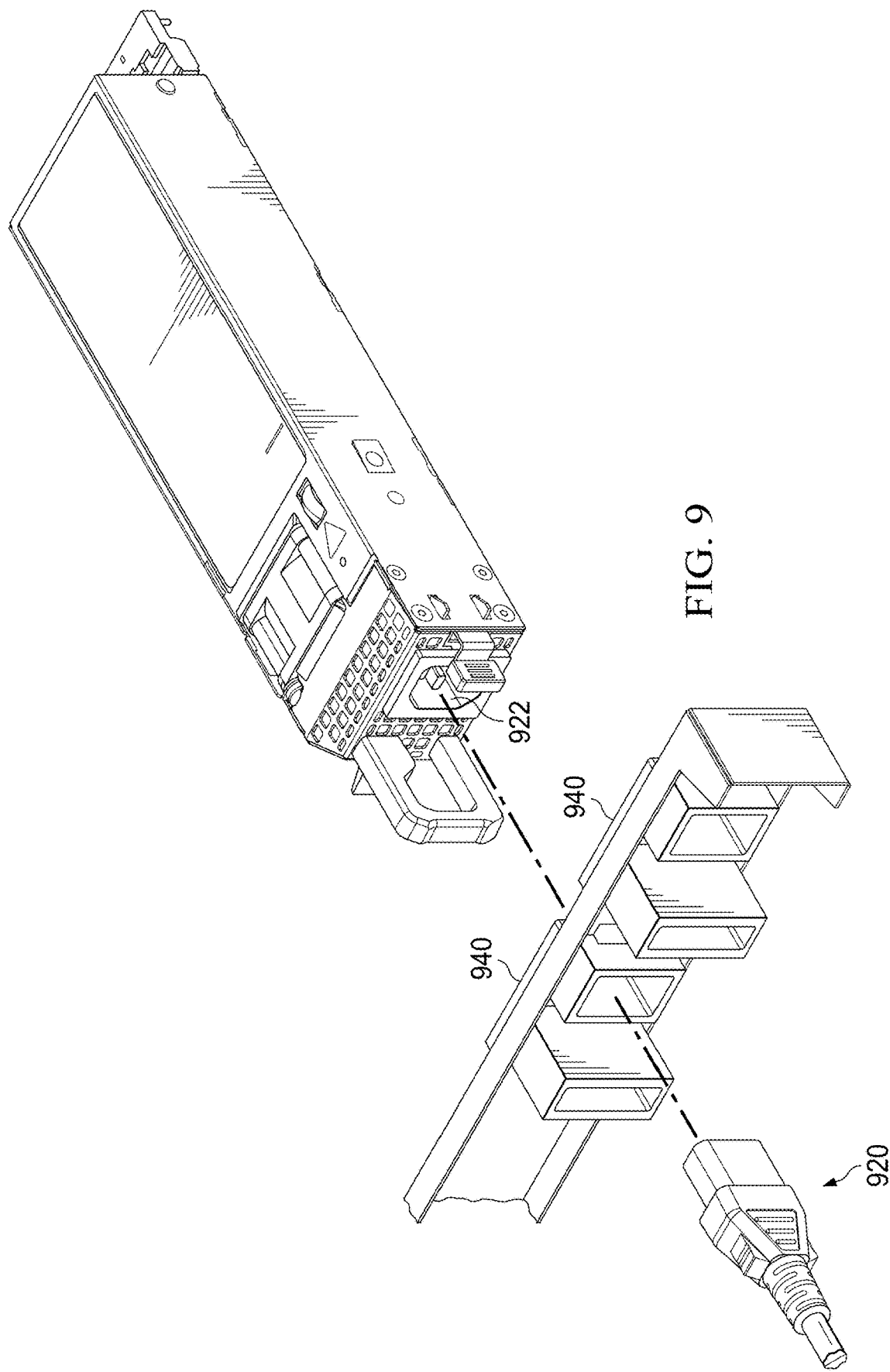
FIG. 9 shows a perspective view of a blind mate power supply alignment system.
Figure 10A:
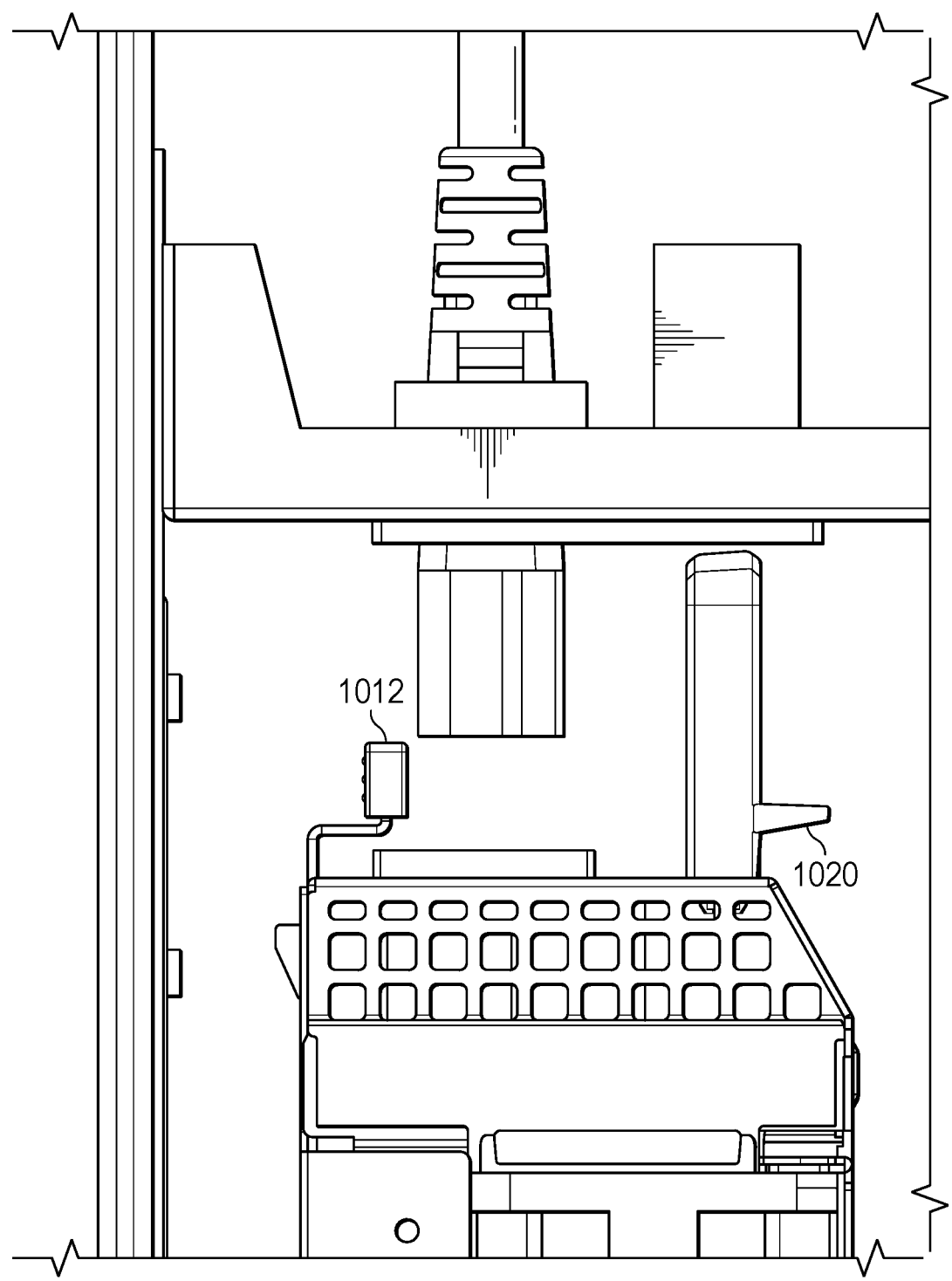
FIGS. 10A and 10B, generally referred to as FIG. 10, show top and perspective views of a blind mate power supply alignment system as a power supply handle engages with a blind mate receptacle.
Figure 10B:
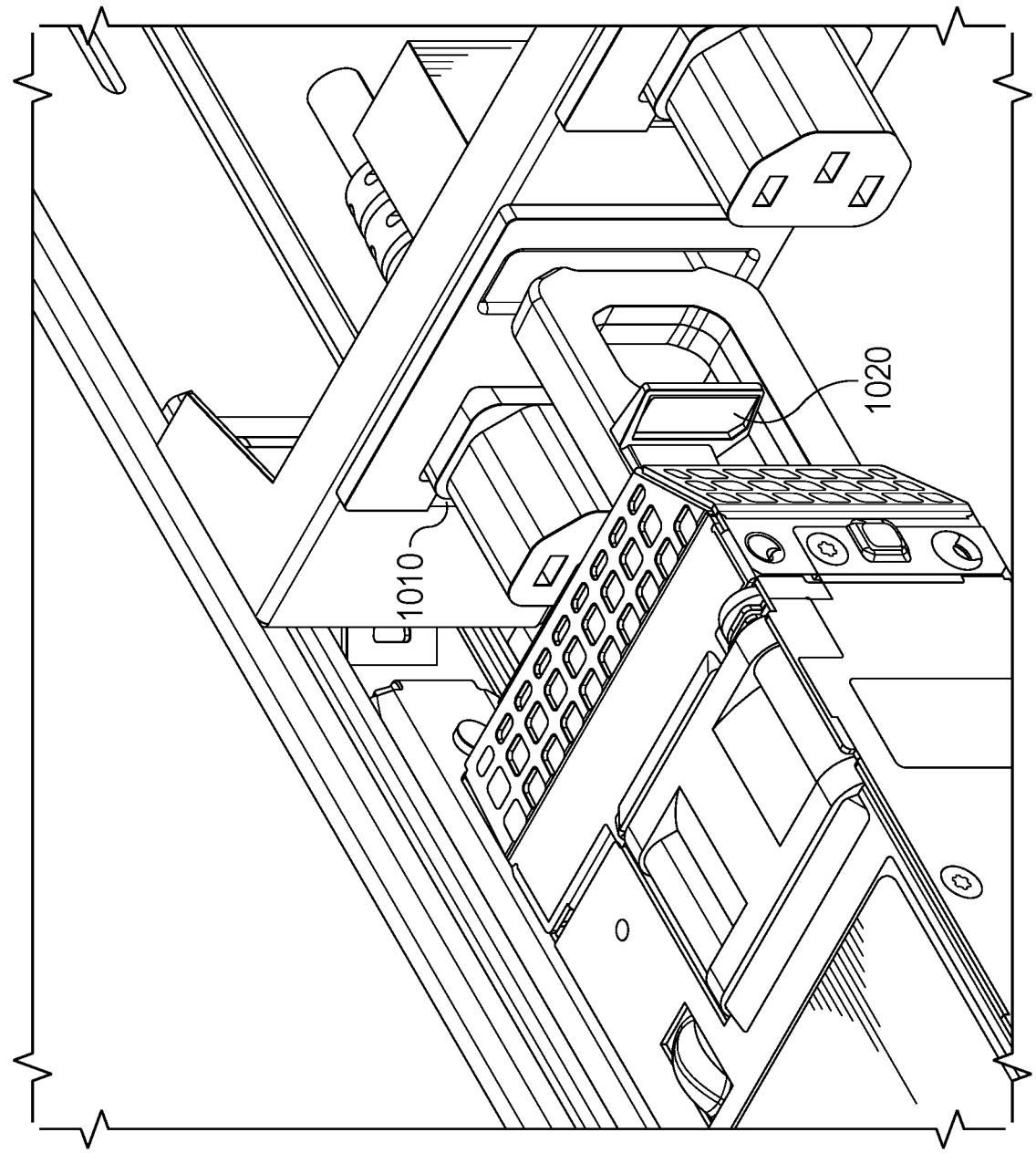
Figure 11A:
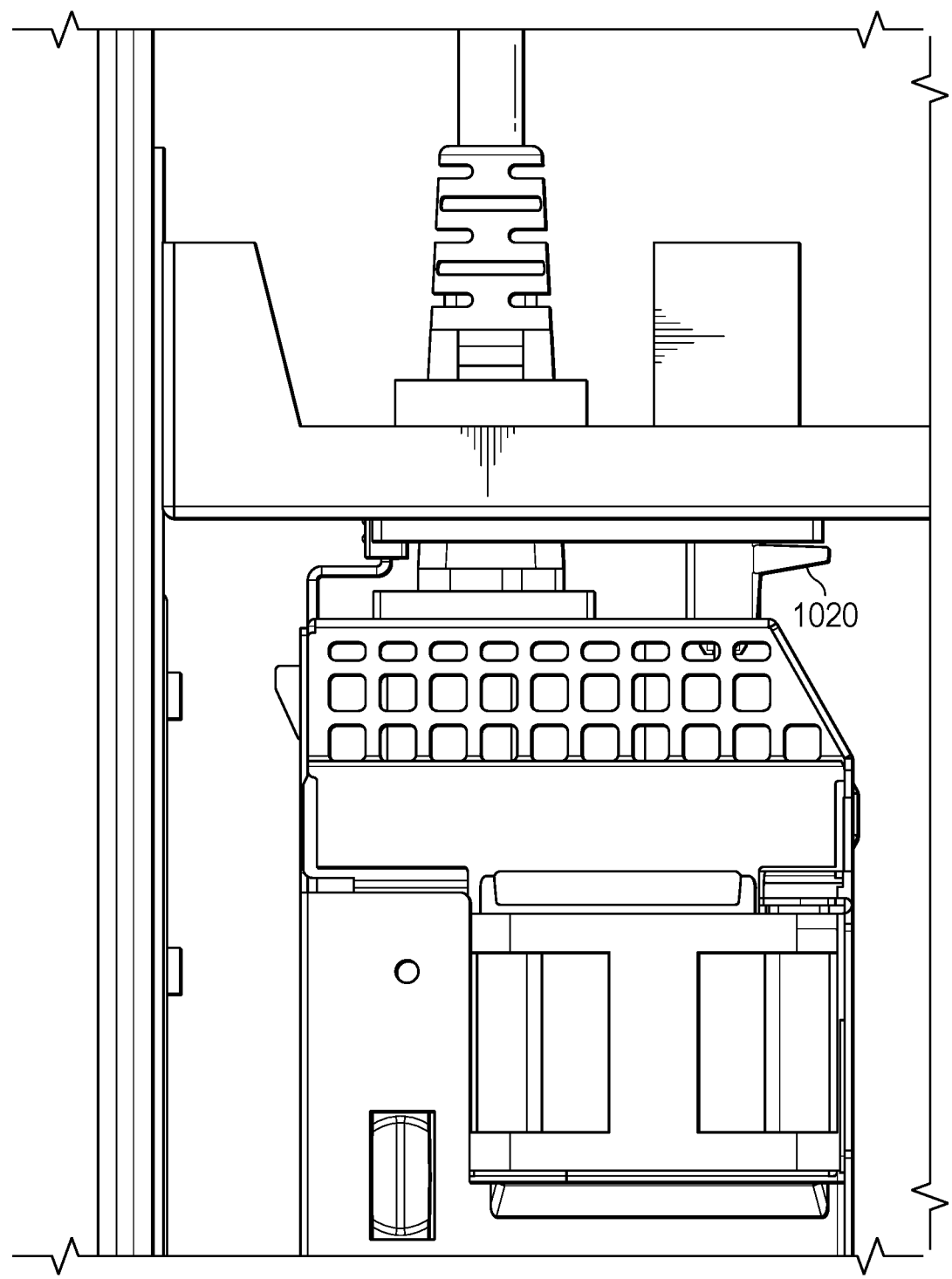
FIGS. 11A and 11B, generally referred to as FIG. 10, show top and perspective views of a blind mate power supply alignment system when a power supply handle is engaged with a blind mate receptacle.
Figure 11B:
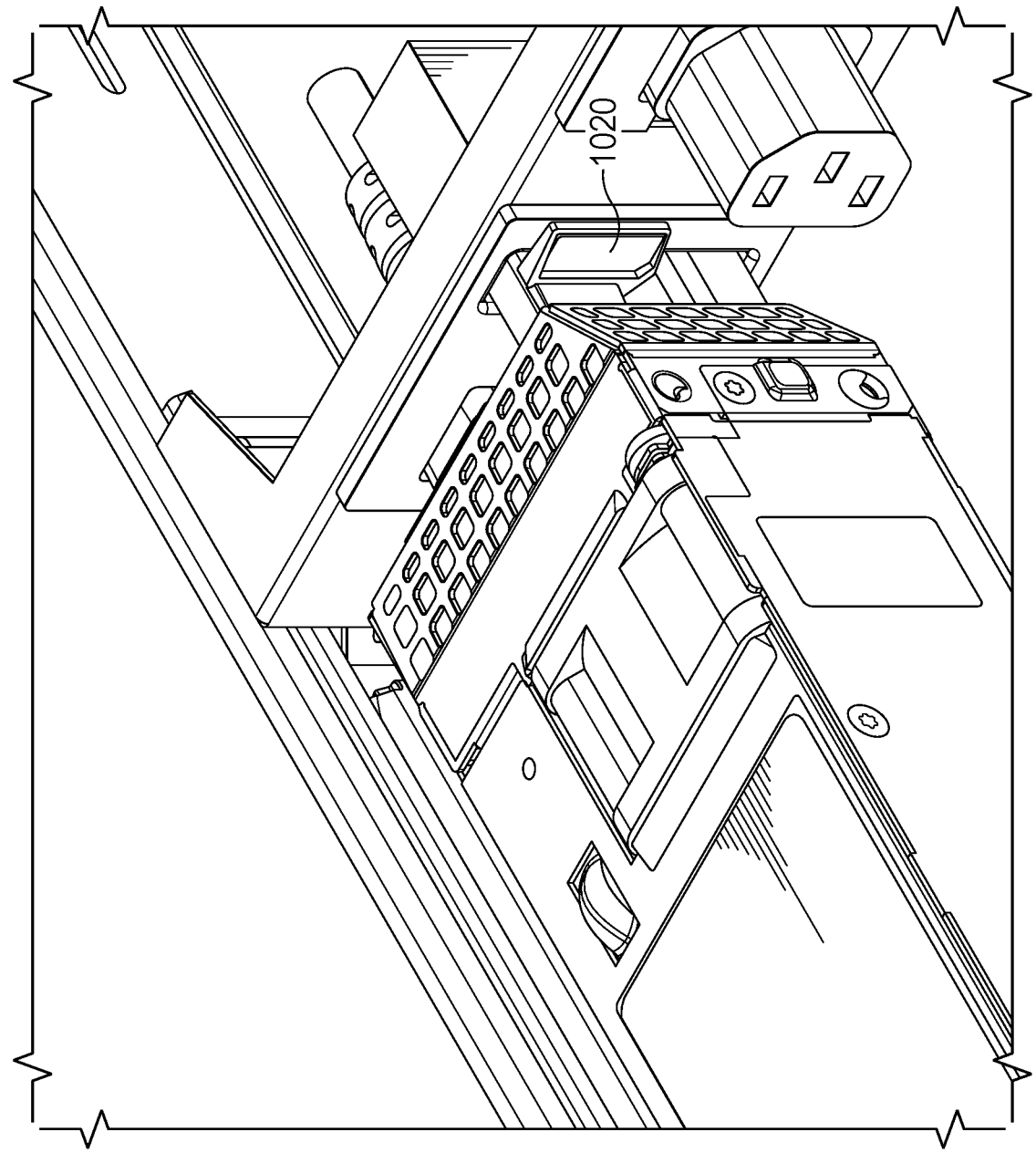

FIG. 7 shows a perspective view of a rack server type information handling system and a portion of a rack to which the rack server type information handling system is mounted. FIG. 8 shows a perspective view of a rear of server type information handling system 800 and rack blind mate rack component 705. FIG. 9 shows a perspective view of a blind mate power supply alignment system. FIGS. 10A and 10B, generally referred to as FIG. 10, show top and perspective views of a blind mate power supply alignment system as a power supply handle engages with a blind mate receptacle. FIGS. 11A and 11B, generally referred to as FIG. 10, show top and perspective views of a blind mate power supply alignment system when a power supply handle is engaged with a blind mate receptacle.

In certain embodiments, the power supplies 710, 712 of the information handling system 700 interact with a blind mate rack component 705 of a rack to provide a blind mate power supply unit alignment system 720. In certain embodiments, the blind mate power supply unit alignment system 720 enables non-guided connectors to mate with existing server power supplies using existing features on the server supply to guide the non-guided connector into an appropriate seating position.

In certain embodiments, the blind mate power supply unit alignment system 720 provides a blind mate power supply unit alignment solution which uses one or more power supply cables 730 attached to a power distribution unit, a rack mount server with fixed power supply unit locations 700, and a blind mate alignment component 740. In certain embodiments, the blind mate alignment component 740 includes one or more pre-defined mounting spaces 810 for the server-side connector 820 of the power supply cable from the power distribution unit. In certain embodiments, the pre-defined mounting spaces 810 for server-side connector of the power supply cable are attached to a blind mate guide facet 750. In certain embodiments, the blind mate guide facet 750 defines a recess which seats over the existing power supply unit handle 830 when the information handling system 700 is inserted into the rack to provide alignment for the server-side connector 920 of the power supply cable 730 with the power supply power receptacle 922.

In certain embodiments, the blind mate guide facet 750 and the cable mounting space 810 are integrated with an alignment system mounting plate 940. In certain embodiments, the alignment system mounting plate 940 is attached to the blind mate rack component 705. In certain embodiments, the blind mate guide facet 750 and the cable mounting space 810 fit within an opening defined by the blind mate rack component 705.

Such a blind mate power supply unit alignment system 740 advantageously uses existing features (e.g., existing connectors and handles) to enable non-guided connectors to mate with existing server power supplies while using existing features on the server supply to guide the non-guided connector into the appropriate seating position. Such a blind mate power supply alignment system 740 may be implemented on whichever power supply unit or cable connector type that is appropriate for the server design.

In certain embodiments, the rack blind mate alignment component 705 defines a clearance aperture 1010. In certain embodiments, the clearance aperture 1010 receives a power supply unit latch 1012 when the power supply is inserted into the rack blind mate alignment component 705. In certain embodiments, the rack blind mate alignment component comprises a single piece molded receptacle.

In certain embodiments, the power supply handle 830 engages with the blind mate guide facet 750 prior to power cord engagement by the power supply (see e.g., FIGS. 10A and 10B). In certain embodiments, the power supply handle 830 includes a stop 1020 to prevent over insertion of the power supply handle 830 into the blind mate guide facet 750 (see, e.g., FIGS. 11A and 11B).

Figure 12A:
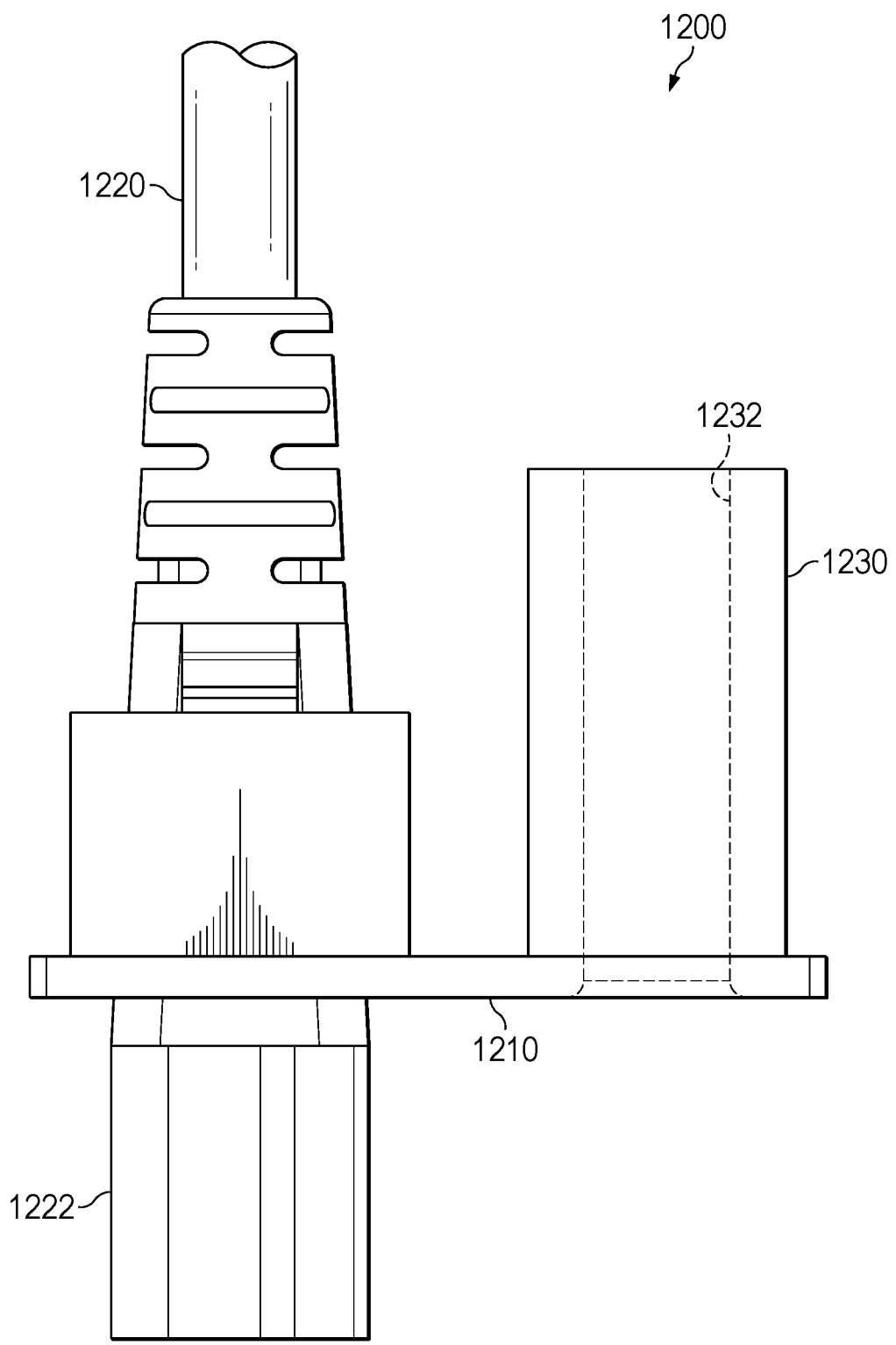
FIGS. 12A, 12B and 12C, generally referred to as FIG. 12, show top, front and perspective views of a portion of rack blind mate alignment system.
Figure 12B:
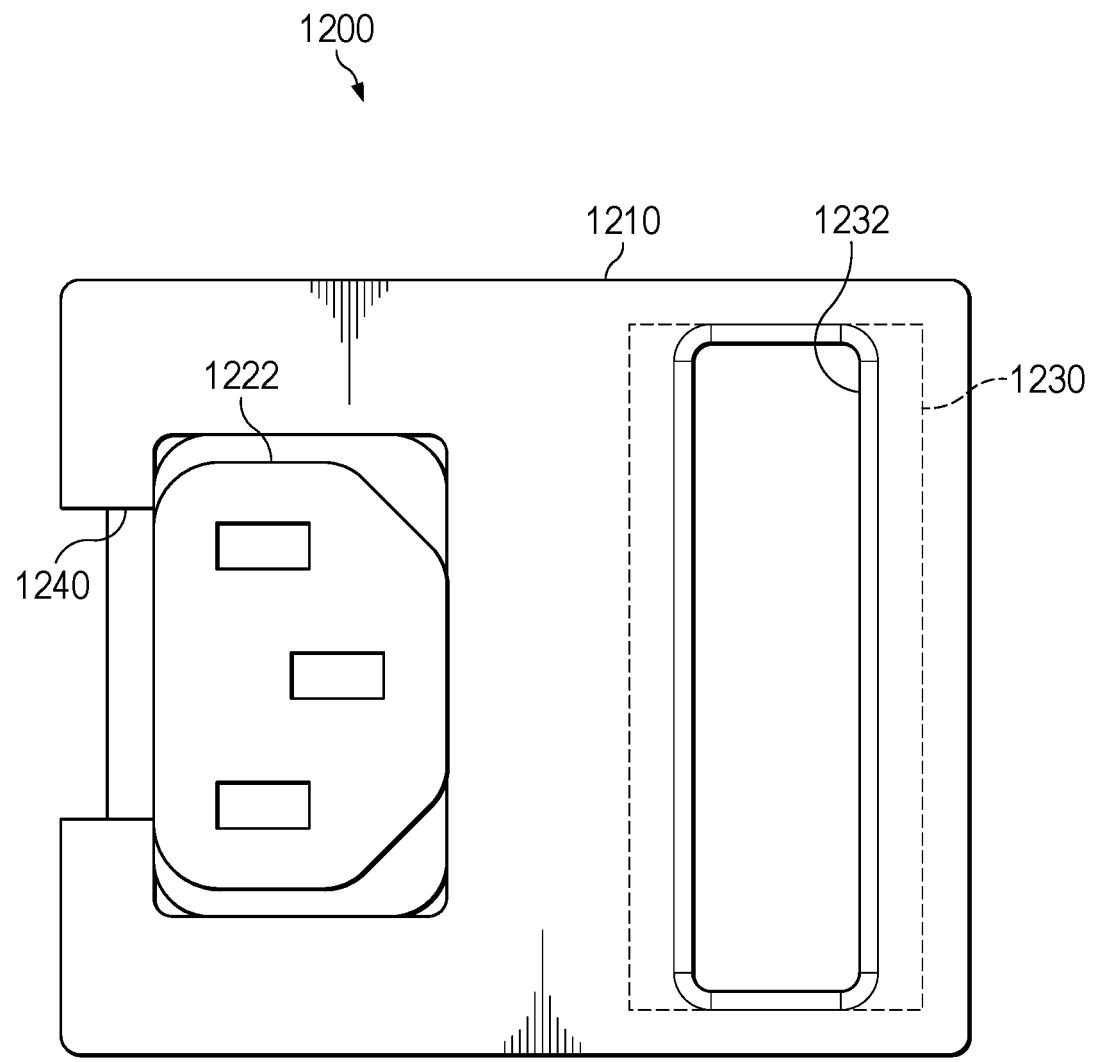
Figure 12C:
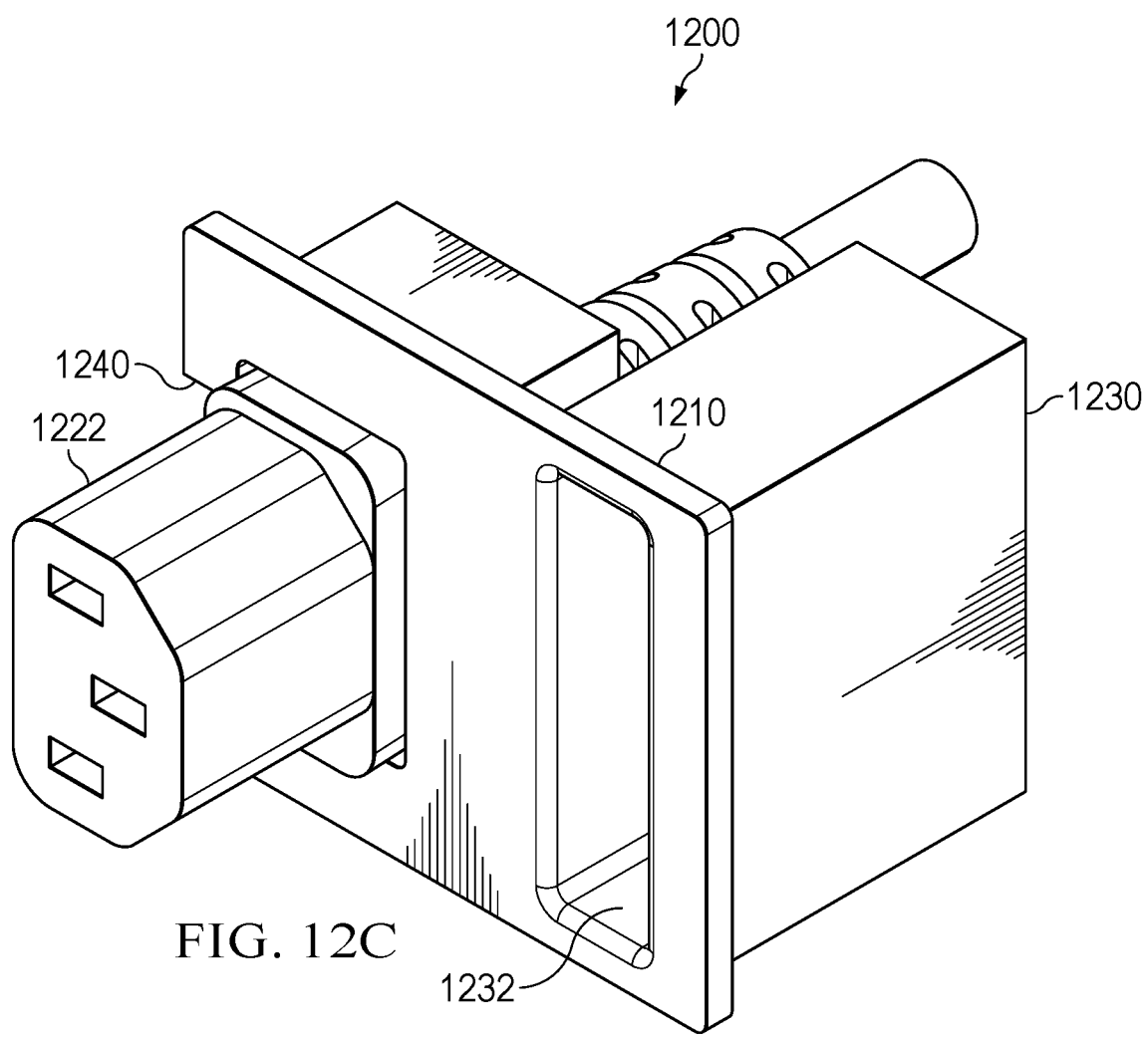

FIGS. 12A, 12B and 12C, generally referred to as FIG. 12, show top, front and perspective views of a rack blind mate alignment component 1200. In certain embodiments, a connector 1220 of a power supply cable 1220 is attached to a mounting plate 1210 of the rack blind mate alignment component 1200. In certain embodiments, a blind mate guide facet 1230 is attached to a rear portion of the mounting plate 1210. In certain embodiments, the blind mate guide facet 1230 defines a guide opening 1232 into which a handle of a power supply fits when the information handling system is inserted into a rack in which the rack blind mate alignment component is mounted. Accordingly, the blind mate guide facet 1230 interacts with the handle of the power supply to provide an alignment function when an information handling system is inserted into a rack having a blind mate adapter. Accordingly, the blind mate guide facet 1230 functions as a blind mate guide component.

In certain embodiments, the rack blind mate alignment component 1200 defines a clearance aperture 1240. In certain embodiments, the clearance aperture 1240 receives a power supply unit latch when the power supply is inserted into the rack blind mate alignment component 1200. In certain embodiments, the rack blind mate alignment component comprises a single piece molded receptacle.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A blind mate rack alignment component for a server type information handling system, comprising:
   an alignment system mounting plate, the alignment system mounting plate defining a mounting space via which a power supply cable connector is coupled to the alignment system mounting plate; and,
   a blind mate alignment portion affixed to the alignment system mounting plate, the blind mate alignment portion comprising a blind mate facet, the blind mate facet defining a recess, the recess mating with a handle of the power supply when the server type information handling system is inserted into a server rack in which the blind mate rate component is mounted, the recess of the blind mate blind mate facet interacting with the handle of a power supply to align the server type information handling system when the server type information handling system is inserted into a server rack in which the blind mate alignment portion is mounted.

2. The blind mate rack component of claim 1, wherein:
   the alignment system mounting plate defines a clearance aperture, the clearance aperture being configured to receive a power supply unit latch when the power supply is inserted into the blind mate alignment component.

3. The blind mate rack component of claim 1, wherein:
   the handle of the power supply includes a stop, the stop preventing over insertion of the handle of the power supply into the blind mate alignment portion.

4. The blind mate rack component of claim 1, wherein:
   the blind mate facet extends from a rear of the alignment system mounting plate.

5. The blind mate rack component of claim 1, wherein:
   the blind mate alignment portion fits within an opening defined by a blind mate rack component.

6. A server rack comprising:
   a blind mate rack component extending across a rear portion of the server rack; and,
   a blind mate rack alignment component mounted to the blind mate rack component, the blind mate rack alignment component comprising
      an alignment system mounting plate, the alignment system mounting plate defining a mounting space via which a power supply cable connector is coupled to the alignment system mounting plate; and,
      a blind mate alignment portion affixed to the alignment system mounting plate, the blind mate alignment portion comprising a blind mate facet, the blind mate facet defining a recess, the recess mating with a handle of the power supply when the server type information handling system is inserted into a server rack in which the blind mate rate component is mounted, the recess of the blind mate blind mate facet interacting with the handle of a power supply to align the server type information handling system when the server type information handling system is inserted into a server rack in which the blind mate alignment portion is mounted.

7. The server rack of claim 6, wherein:
the alignment system mounting plate defines a clearance aperture, the clearance aperture being configured to receive a power supply unit latch when the power supply is inserted into the blind mate alignment component.

8. The server rack of claim 6, wherein:
the handle of the power supply includes a stop, the stop preventing over insertion of the handle of the power supply into the blind mate alignment portion.

9. The server rack of claim 6, wherein:
the blind mate facet extends from a rear of the alignment system mounting plate.

10. The server rack of claim 6, wherein:
the blind mate alignment portion fits within an opening defined by the blind mate rack component.

\* \* \* \* \*